United States Patent [19]

Young

[11] Patent Number: 4,710,647
[45] Date of Patent: Dec. 1, 1987

[54] SUBSTRATE BIAS GENERATOR INCLUDING MULTIVIBRATOR HAVING FREQUENCY INDEPENDENT OF SUPPLY VOLTAGE

[75] Inventor: Ian Young, Portland, Oreg.

[73] Assignee: Intel Corporation, Santa Clara, Calif.

[21] Appl. No.: 830,469

[22] Filed: Feb. 18, 1986

[51] Int. Cl.$^4$ .......................... H03L 1/00; G05F 1/56
[52] U.S. Cl. ................................. 307/297; 307/200 B;
307/269; 307/271; 307/296 R; 307/475;
307/496
[58] Field of Search ................... 307/200 B, 475, 494,
307/496, 497, 264, 269, 271, 296 R, 297, 304;
323/311–316

[56] References Cited

U.S. PATENT DOCUMENTS

| | | | |
|---|---|---|---|
| 4,409,496 | 10/1983 | Baba | 307/296 R |
| 4,471,290 | 9/1984 | Yamaguchi | 307/200 B X |
| 4,507,572 | 3/1985 | Hashimoto et al. | 307/296 R |
| 4,622,480 | 11/1986 | Uchimura et al. | 307/200 B X |
| 4,631,421 | 12/1986 | Inoue et al. | 307/297 |
| 4,670,668 | 6/1987 | Liu | 307/200 B X |

OTHER PUBLICATIONS

Hummel, "Sentry Circuit for Substrate Voltage Control", *IBM T.D.B.*, vol. 15, No. 2, Jul. 1972, pp. 478–479.
Harroun, "Substrate Bias Voltage Control", *IBM T.D.B.*, vol. 22, No. 7, Dec. 1979, pp. 2691-2692.

*Primary Examiner*—Stanley D. Miller
*Assistant Examiner*—D. R. Hudspeth
*Attorney, Agent, or Firm*—Blakely, Sokoloff, Taylor & Zafman

[57] ABSTRACT

A CMOS charged pump circuit for biasing the N well of a memory array. The present invention utilizes a multivibrator oscillator coupled to a constant current source to provide a frequency output which is independent of the supply voltage. The multivibrator oscillator uses less power than prior art ring oscillators. Feedback through a comparator circuit is used to monitor the N well voltage so that the multivibrator oscillator and ultimately the charge pump may be duty cycled to further reduce power consumption.

18 Claims, 5 Drawing Figures

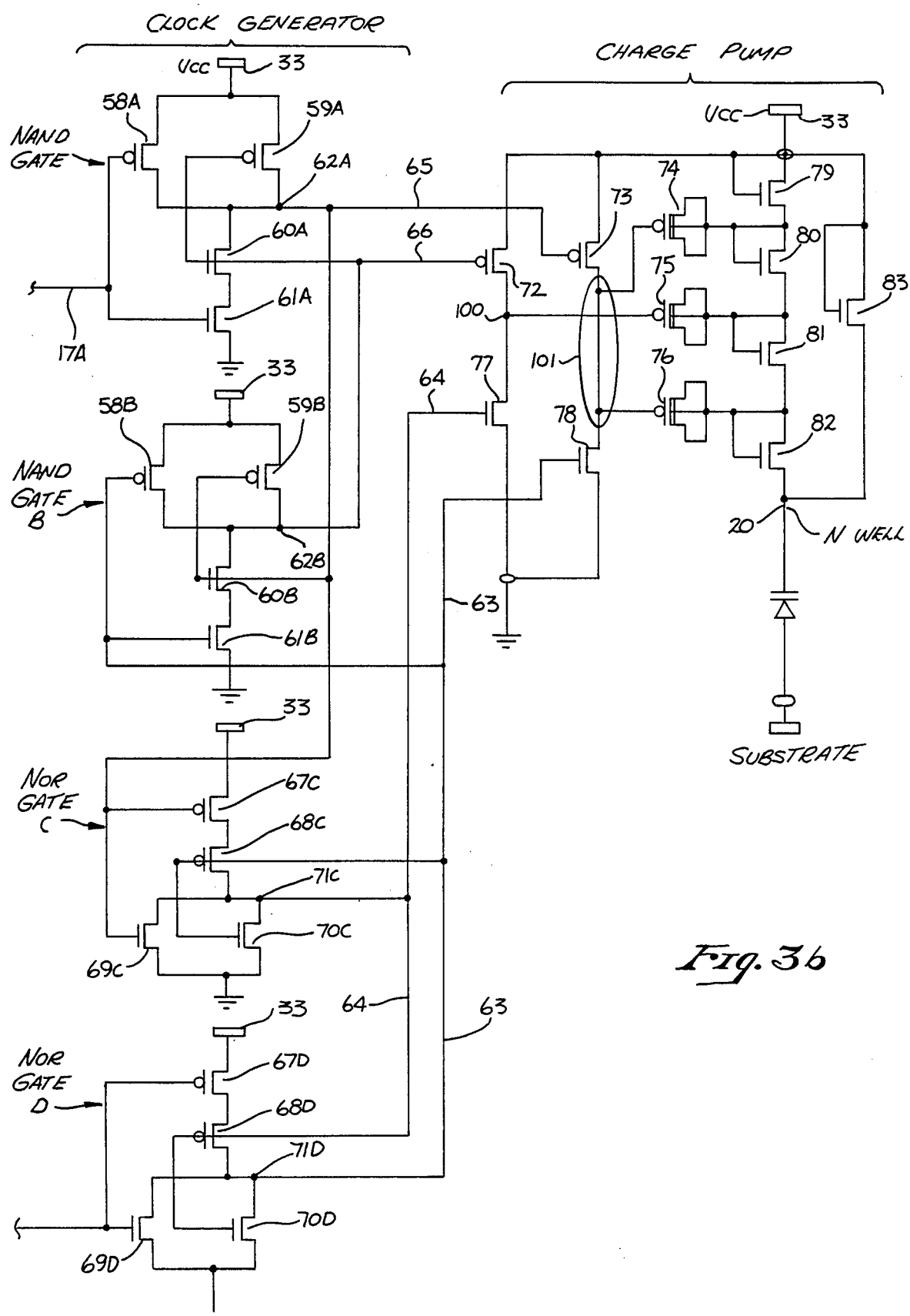

SUBSTRATE BIAS GENERATOR INCLUDING MULTIVIBRATOR HAVING FREQUENCY INDEPENDENT OF SUPPLY VOLTAGE

BACKGROUND OF THE INVENTION

1. Field of the Invention

This invention relates to the field of complementary metal oxide silicon (CMOS) memory arrays and a means for biasing a well in which such memory arrays are formed.

2. Background Art

Memory arrays processed using CMOS technology often include memory cells formed in a well of a P or N conductivity type. It is often desired to bias this well to a voltage level above that of the supply voltage for N-well CMOS memory arrays, or below the power supply ground for P-well CMOS arrays. The well is biased in order to reduce leakage current (both isolation and access transistor) in the memory array cell.

In the past, a ring oscillator coupled to a substrate pump was utilized to provide biasing. A disadvantage of ring oscillators is the strong dependence of the output frequency on the supply voltage. The frequency of the ring oscillator is proportional to the square of the supply voltage. Thus, even small changes in supply voltage can create large shifts in output frequency. A second disadvantage of the previous method results from the use of a substrate pump. The substrate pump must supply, in addition to the injection and avalanche multiplication currents in the substrate, the leakage current of the memory array. These additional currents require large power consumption by the ring oscillator and charge pump.

In order to overcome the disadvantage of varying frequency, the prior art has provided a voltage regulated lower bias supply to the ring oscillator. Although this reduces power consumption of the oscillator and provides a more constant oscillating frequency source, the voltage regulator providing this regulated bias voltage supply dissipates the power drop to the oscillator as well as consuming additional power itself as needed to provide a constant regulated voltage.

Other attempts to reduce power consumption include duty cycling the ring oscillator when the pump node has reached its regulated voltage. In order to determine when to shut off the oscillator, prior art methods have utilized an inverter as a comparator having a trip point as a reference at approximately VCC/2. When the inverter is tripped, the oscillator is shut off, and does not draw power until the substrate node falls below the reference level voltage. This method has a further disadvantage of unacceptable process sensitivity.

Therefore, it is an object of the present invention to provide a means for supplying leakage currents to a memory array, particularly a CMOS memory array having low power consumption, frequency independence, and process insensitivity.

It is a further object of the present invention to provide a means for biasing a well of a memory array in which the frequency output is independent of the supply voltage.

It is a further object of the present invention to provide a means for biasing a well of a CMOS memory array in which the well voltage maintains a constant relationship to the supply voltage.

SUMMARY OF THE PRESENT INVENTION

The present invention provides a well pump which utilizes a multivibrator oscillator coupled to a constant current source to provide a frequency independent of supply voltage. The output of the oscillator is coupled to a charge pump which biases the well of a memory array. A feedback loop compares the well voltage to a reference voltage which represents the desired difference between well and supply voltage. The present invention also compares the well voltage to a second reference voltage to determine when the circuits interfacing with the memory array should be powered up. This second reference is approximately 300 millivolts above the supply voltage. Translation means are used to convert the well voltage from a value representing VCC plus approximately the desired difference volts to a value representing VCC minus approximately the desired difference. A comparator compares this value with the constant reference voltage and the output is used to duty cycle the multivibrator oscillator.

BRIEF DESCRIPTION OF THE DRAWINGS

FIGS. 3A and 3B are an electrical schematic illustrating the preferred embodiment of the present invention.

DETAILED DESCRIPTION OF THE INVENTION

A CMOS well pump is described which has low power consumption and utilizes a current source whose output is independent of the supply voltage. In the following description, numerous specific details are set forth, such as voltage levels, conductivity types, etc., in order to provide a more thorough understanding of the present invention. It will be obvious, however, to one skilled in the art, that the present invention may be practiced without these specific details. In other instances, well known circuits have not been shown in detail in order not to unnecessarily obscure the present invention.

The present invention is a well pump which is used to bias the well of a memory array. In particular, the present invention is advantageously used in conjunction with a memory array fabricated using complementary metal oxide silicon (CMOS) technology. The well pump may be used to bias the well of a memory array above the power voltage (for N-well CMOS memory arrays), or below the power supply ground (for P-well CMOS memory arrays) at a constant voltage bias with respect to the supply voltage VCC (or VSS). The present invention supplies this constant voltage difference independently of the supply voltage or process parameters. The present invention provides this well bias with a minimum of power consumption.

Figure 1:
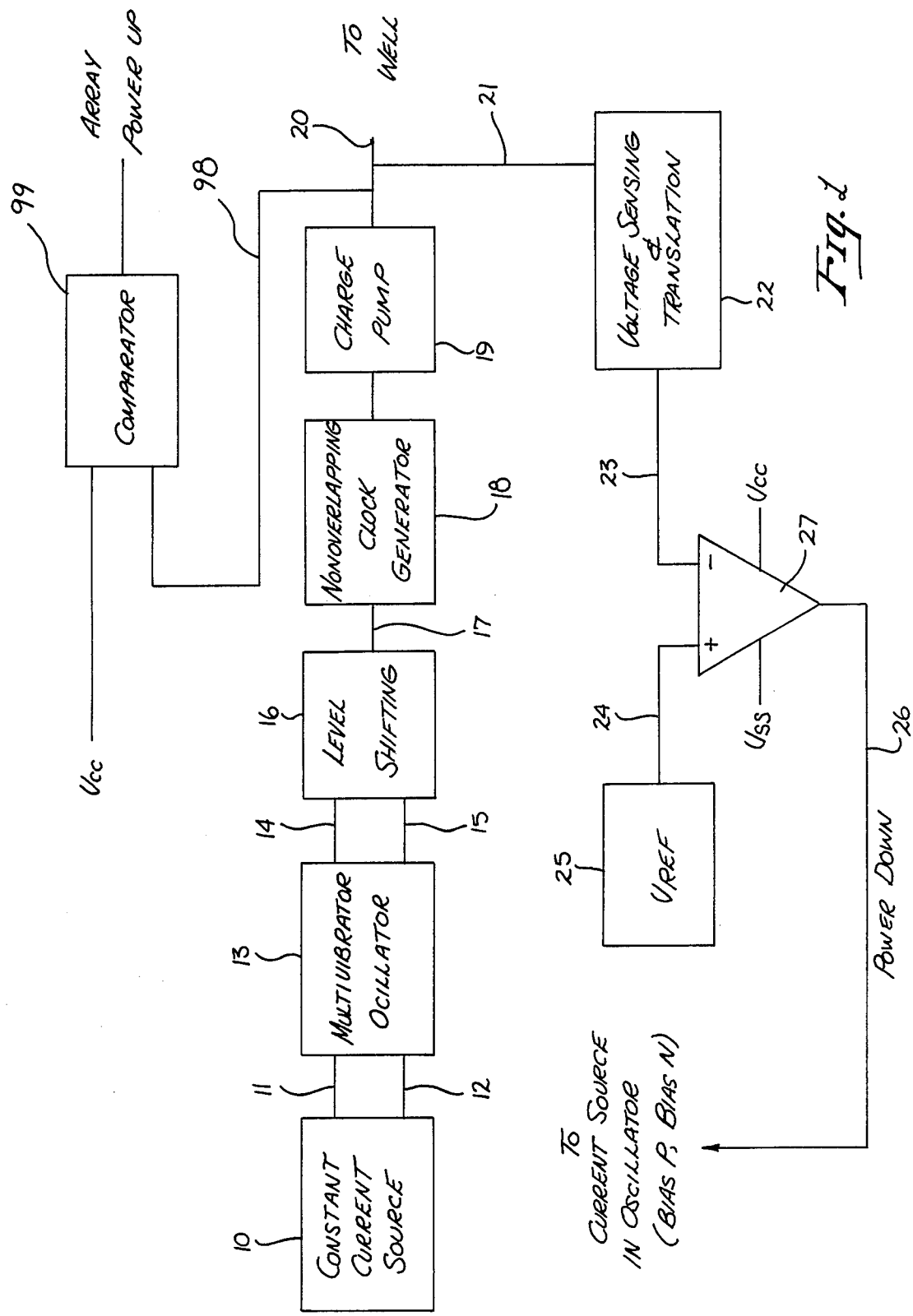
FIG. 1 is a block diagram illustrating the layout of the present invention.

FIG. 1 illustrates a block diagram of the layout of the present invention. Current supplies provided by the constant current source 10 supplies current biasing through lines 11 and 12 to oscillator 13. The constant current source 10 has a fixed level of output regardless of the supply voltage. The multivibrator oscillator 13 replaces the ring oscillator used with prior art substrate pumping methods. Prior art ring oscillators have a strong dependence on supply voltage. In the present invention, the multivibrator oscillator 13, coupled to the constant current source 10, has a frequency output independent of the supply voltage.

The output of multivibrator oscillator 13 is a small differential output which is coupled on lines 14 and 15 to level shifting circuit 16. The level shifting circuit 16 amplifies the small differential output and feeds it to the non-overlapping clock generator 18. The output of non overlapping clock generator 18 is coupled to charge pump 19. The output of charge pump 19 is coupled to the well of a memory array at node 20 and the charge pump is used to bias the well to a level above supply voltage or below VSS, depending upon the conductivity type of the well.

The well is coupled through line 21 to a voltage sensing and translation means 22. The translation means is used to convert the well voltage from VCC plus some amount VNW to VCC minus VNW. The translation means shows a large resistance to the well so that a minimum of current is drawn from the well. This output is fed on line 23 to the inverting input of comparator 27. VREF 25 represents the supply voltage minus desired voltage difference. VREF is coupled through line 24 to the non inverting input of comparator 27. The output of comparator 27 is coupled to the oscillator 13. When the voltage difference exceeds the desired reference voltage, the oscillator 13 is powered down, ceasing its output. The oscillator remains powered down until the well voltage falls below the desired bias voltage, at which point the oscillator is powered up.

As an additional feature of the present invention a second comparator 99 is used to determine when there is sufficient well bias to power up the memory array. The well is coupled through line 98 to comparator 99. Comparator 99 is also coupled to supply voltage VCC. Comparator 99 is biased so that when the well is biased a certain amount above the supply voltage, the memory array may be powered up. In the preferred embodiment of the present invention, the array is powered up when the well bias exceeds the supply voltage by 300 millivolts.

Figure 2:
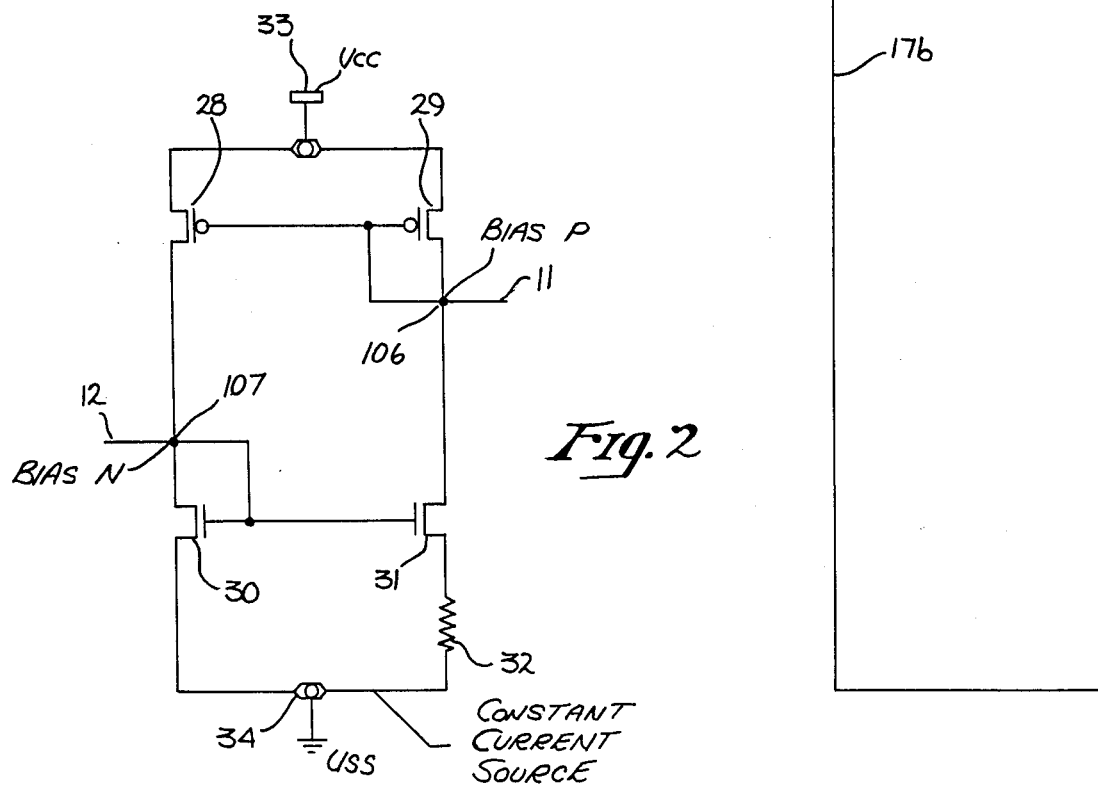
FIG. 2 is an electrical schematic illustrating the constant current source of the present invention.

The constant current source is shown in detail in FIG. 2. A pair of gate coupled P channel transistors 28 and 29 are source coupled to the supply voltage VCC 33. Gate coupled N transistors 30 and 31 are drain coupled to P transistors 28 and 29 respectively. The source of transistor 31 is coupled through resistor 32 to VSS 34. The source of transistor 30 is also coupled to VSS. The gates of transistors 28 and 29 are coupled to the drains of transistors 29 and 31 at node 106. The gates of transistors 30 and 31 are coupled to the drains of transistors 28 and 30 at node 107. Bias P signal 11 is taken from node 106 and bias N signal 12 is taken from node 107. It can be seen that when VCC increases, the current in N transistors 30 and 31 tries to increase the voltage drop across resistor 32 and reduces gate to source voltage on transistor 31, opposing any current increase (i.e. negative feedback loop operates). In this manner, the bias P signal 11 and bias N signal 12 may be kept constant.

MULTIVIBRATOR OSCILLATOR

Figure 3A:
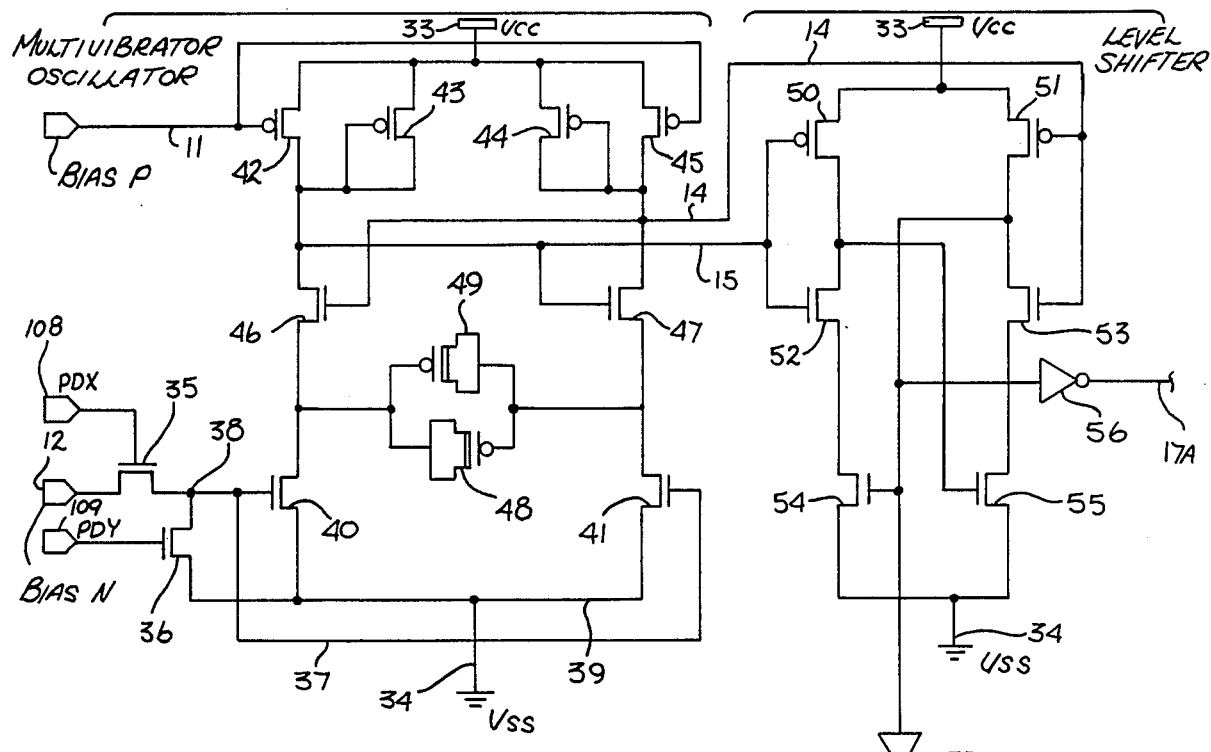

The multivibrator oscillator is shown in greater detail in FIG. 3A. The bias N signal 12 is coupled through N transistor 35 to the drain of N transistor 36 and the gates of N transistors 40 and 41. The gate of transistor 35 is coupled to PDX 108 while the gate of transistor 36 is coupled to PDY 109. PDX 108 and PDY 109 are used to enable the oscillator. When the oscillator is off, PDY 109 is at VCC and PDX 108 is at VSS. To enable the oscillator, PDX 108 is taken to VCC and PDY 109 is taken to VSS.

Transistors 40 and 41 are source coupled to VSS 34. Bias P signal 11 is coupled to the gates of P channel transistors 42 and 45 which are source coupled to VCC 33. The drain of transistor 42 is coupled to the gate and drain of P channel transistor 43. The source of transistor 43 is also coupled to VCC. The drain of transistor 45 is coupled to the gate and drain of P channel transistor 44, whose source is coupled to VCC 33.

Transistor 42 is also drain coupled to N channel transistor 46 and transistor 45 is drain coupled to N channel transistor 47. Transistors 46 and 47 are cross coupled with the gate of transistor 47 coupled to the drain of transistor 46 and the gate of transistor 46 coupled to the drain of transistor 47. The source of transistor 46 is coupled to the drain of transistor 40 while the source of transistor 47 is coupled to the drain of transistor 41. The source of transistor 46 is coupled through a capacitor to the source of transistor 47.

The capacitor is comprised of P channel transistors 48 and 49. In the preferred embodiment of the present invention, the capacitors comprise depletion transistors (as shown) however, any suitable capacitors may be utilized in the present invention. The source and drain of transistor 49 are coupled to the gate of transistor 48 and to the source of transistor 47. The source and drain of transistor 48 are coupled to the gate of transistor 49 and to the source of transistor 46.

N channel transistors 40 and 41 and P channel transistors 42 and 45 are current sources for cross coupled transistors 46 and 47 and the associated capacitor. Line 14, coupled to the drain of transistor 47, and line 15, coupled to the drain of transistor 46, carry the output of the multivibrator oscillator. This output is a small differential output whose frequency is determined by the size of the capacitor and the current source values. The signal on line 14 is the complement of the signal on line 15. This output is coupled to the level shifter, also shown in FIG. 3A.

VOLTAGE LEVEL SHIFTER

The output on line 14 is coupled to the gates of P channel transistor 51 and N channel transistor 53. The output on line 15 is coupled to the gates of P channel transistor 50 and N channel transistor 52. Transistors 50 and 51 are source coupled VCC 33. Transistor 50 is drain coupled to transistor 52 while transistor 51 is drain coupled to transistor 53. The source of transistor 52 is coupled to the drain of N transistor 54. The source of transistor 53 is coupled to the drain of N transistor 55. Transistors 54 and 55 are source coupled to VSS 34. The gate of transistor 54 is coupled to the drain of transistor 51 while the gate of transistor 55 is coupled to the drain of transistor 50. Inverters 56 and 57 are coupled to the gate of transistor 54. The outputs of inverters 56 and 57 are coupled through lines 17A and 17B respectively to the clock generator circuit, shown in FIG. 3B.

CLOCK GENERATOR

The non overlapping clock generator is comprised of nand gates A and B and nor gates C and D. In the preferred embodiment of the present invention, nand gate A is comprised of P channel transistors 58A and 59A source coupled to VCC 33 and drain coupled to N channel transistors 60A and 61A, coupled in series to VSS. The gate of transistor 59A is coupled to the gate of transistor 60A. The gate of transistor 58A is coupled to the gate of transistor 61A and to line 17A. The ouput of nand gate A is taken from node 62A, which is the junction of the drains of transistors 58A and 59A and 60A.

Nand gate B is constructed similarly with the output of nand gate B coupled to the gates of transistor 59A and 60A of nand gate A. Correspondingly, the gates of transistors 58B and 60B of nand gate B are coupled to the output of nand gate A.

The outputs of nand gate A and B on line 65 and 66 respectively are non overlapping signals which are coupled to the charge pump of the present invention.

In the preferred embodiment in the present invention, nor gate C is comprised of P channel transistor 67C and 68C coupled in series with the source of transistor 67C coupled to VCC 33 and the drain of transistor 68C coupled to the drains of N channel transistors 69C and 70C. Transistor 69C and 70C are source coupled to VSS 34. The gates of transistor 67C and 69C are coupled to the output of nand gate A. The gates of transistor 68C and 70C are coupled to the output of nor gate D. The output of nor gate C is taken from node 71C which is the junction of the drains of transistor 69C, 70C and 68C and is coupled through line 64 to the charge pump of the present invention.

Nor gate D is configured in a manner similar to nor gate C with the output of nor gate C coupled to the gates of transistor 68D and 70D of nor gate D. The gates of transistors 67D and 69D are coupled to the output on line 17B of the level shifter. The output of nor gate D is coupled to the gates of transistors 58D and 61D of nand gate B as well as to the charge pump through line 63.

The signals on line 63 and 64 are the complements of the signals on line 65 and 66 respectively.

CHARGE PUMP

The charge pump consists of a string of N channel series transistors 79 through 82, coupled in parallel with N transistor 83 to VCC 33 and the N well node 20. The gate of transistor 83 is coupled to its own drain. The gates of transistors 79 through 82 are each coupled to their own drains. These series transistors are controlled by the output of the clock generator. The gate of transistor 79 is coupled to the source of P channel transistors 72 and 73. The gate of transistor 73 is coupled to signal on line 65 and the gate of transistor 72 is coupled to the signal on line 66. The drains of transistor 72 and 73 are coupled to the drains of N channel transistors 77 and 78 respectively at nodes 100 and 101. The sources of transistors 77 and 78 are coupled to ground. The gate of transistor 77 is coupled to the signal on line 64. The signal on line 63 is coupled to the gate of transistor 78. The drain of P channel transistor 72 is coupled to the gate of P channel transistor 75.

The source and drain of transistor 75 are each coupled to the gate of transistor 81. The drain of transistor 73 is coupled to the gates of P channel transistors 74 and 76. The source and drain of transistor 74 are coupled to the gate of transistor 80 and the source and drain of transistor 76 are coupled to the gate of transistor 82. The source and drains of transistors 74 through 76 are also coupled to the N well in which they are formed. These transistors (74 through 76) function as capacitors and in conjunction with transistors 79 through 82 form a three stage charge pump. Transistors 74 through 76 may be depletion transistors, as shown, or may be replaced by any suitable capacitors.

The gate of transistor 75 is coupled to the drains of transistors 72 and 77 at node 100. The gates of transistors 74 and 76 are coupled to the drains of transistors 73 and 78 and node 101. During the operation of the charge pump, nodes 100 and 101 are alternately at 5 volts and ground respectively. When node 101 is at ground, transistor 74, acting as a capacitor, is charged to VCC minus VTN (through transistor 79). Node 101 is then charged to VCC and node 100 is at ground. Transistor 74 discharges through transistor 80 and transistor 75 is charged to approximately 1.6 VCC-VTN.

Next, node 101 returns to ground and node 100 charges to VCC. As a result, transistor 75 discharges through transistor 81 and charges transistor 76 to approximately 2.8 VCC-2 VTN. When node 101 returns to VCC, transistor 76 discharges through transistor 82 to the N well node 20.

During initial power up to VCC, transistor 83 raises the voltage of the N well node 20 to VCC minus VTN. When the charge pump is off, transistor 83 acts as a clamping device to prevent the N well from going below VCC minus VTN.

TRANSLATION CIRCUIT AND COMPARATOR

Figure 4:
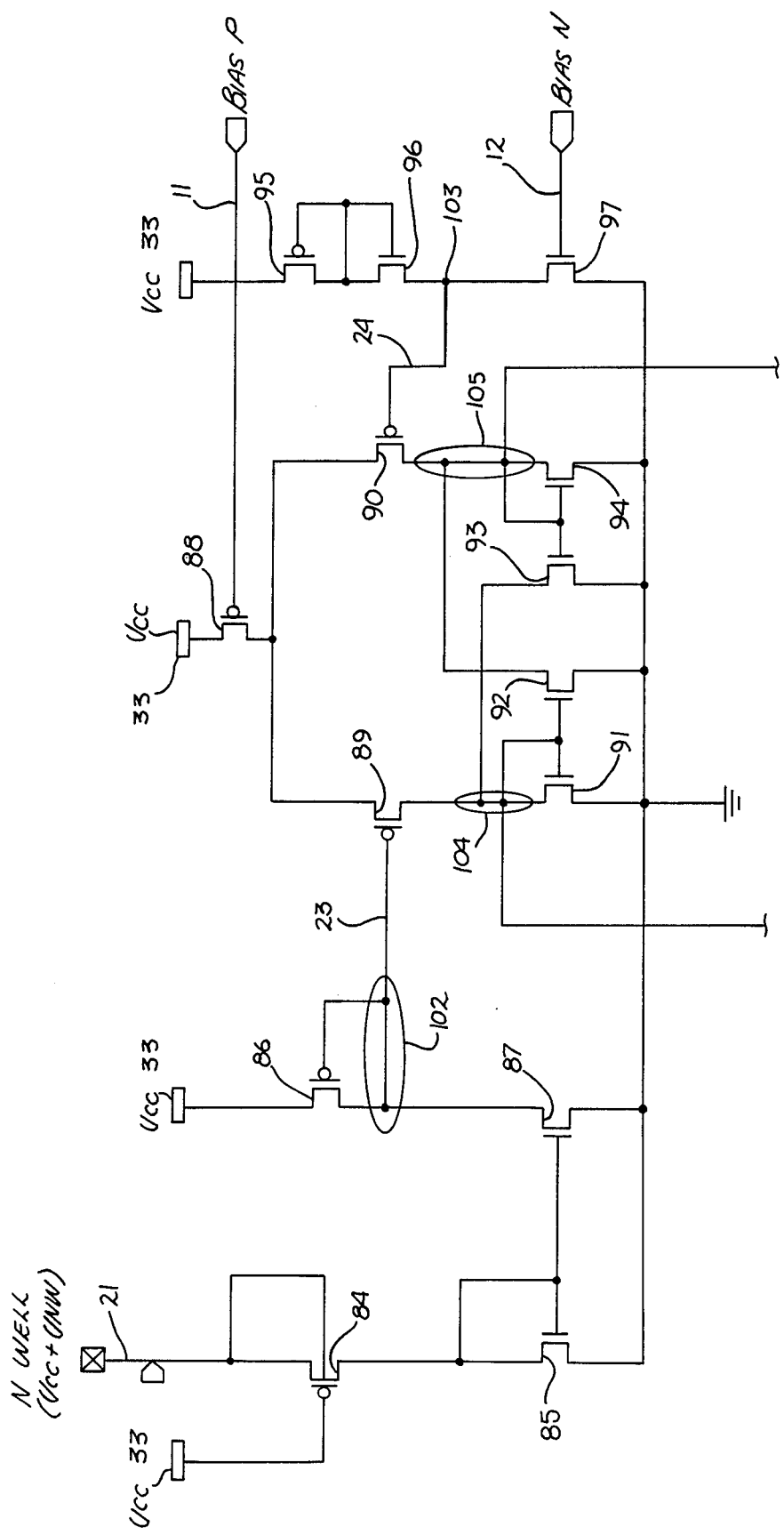
FIG. 4 is an electrical schematic illustrating the comparing means of the present invention.

The voltage translation circuit and comparator are shown in detail in FIG. 4. The voltage translation means consists of P transistors 84 and 86 and N transistors 85 and 87. The gate of P channel transistor 84 is coupled to VCC 33. The source of transistor 84 is coupled to the N well while the drain of transistor 84 is coupled to the drain of transistor 85 and the gates of both transistors 85 and 87. The sources of N transistors 85 and 87 are coupled to VSS 34 and the drain of transistor 87 is coupled to the drain and gate of P channel transistor 86 at node 102. The source of transistor 86 is coupled to VCC 33. Node 102 is the output of this translator and is coupled through line 23 to the gate of P channel transistor 89 comparator circuit. The N well voltage coupled to transistor 84 is some amount VNW above VCC. The well voltage is sensed with current across transistor 84 and turns on transistors 85 and 87, which form a current mirror. Transistor 86 is biased on with the mirrored current from transistor 84 such that gate-source voltages for transistors 84 and 86 are equal. Node 102 thus represents 2 VCC voltage minus the N well voltage. 2 VCC-N well voltage (or VCC-VNW) is inputed to the comparator on line 23.

The other input to the comparator is generated by P transistor 95 and N transistors 96 and 97. The source of P transistor 95 is coupled to VCC 33. The gate and drain of transistor 95 are coupled to the gate and drain of N transistor 96. The source of transistor 96 is coupled to the drain of transistor 97 at node 103. The source of transistor 97 is coupled to VSS 34. The gate of transistor 97 is coupled to the biasN signal 12. VTP of transistor 95 plus VTN of transistor 96 is the voltage reference output of this circuit and is coupled at node 103 to line 24. VTP plus VTN is biased by N transistor 97 through the biasN signal 12. In the preferred embodiment of the present invention, transistors 95 and 96 are such that the output of the circuit on line 24 is approximately 2.5 volts below VCC and is coupled to the comparator on line 24.

The comparator of the present invention comprises P channel transistors 88, 89 and 90 and N channel transistors 91, 92, 93 and 94. The sources of N channel transistors 91 through 94 are coupled to VSS 34. The gates of transistors 91 and 92 are coupled to the drains of transistors 91 and 93 at node 104. The gates of transistors 93 and 94 are coupled to the drains of transistors 92 and 94 at node 105. Node 104 is coupled through P channel transistor 89 to the drain of P channel transistor 88. Node 105 is coupled through P channel transistor 90 (whose gate is coupled to line 24) to the drain of P channel transistor 88. The source of P channel transistor 88 is coupled to VCC 33 and the gate of transistor 88 is coupled to the biasP signal 11. Nodes 104 and 105 are the outputs of the comparator circuit. The comparator shown relates to comparator 27 of FIG. 1. However, a similar configuration can be used for comparator 99 of FIG. 1.

The outputs of the comparator at nodes 104 and 105 are coupled to a level shifter to provide a full swing between VSS and VCC. The outputs of this level shifter (not shown) are PDX 108 and PDY 109. As described above, these signals power down the multivibrator oscillator of the present invention.

Although the present invention has been described with application to a well pump, it can be applied to bias the substrate or any other portion of a semiconductor body.

Thus, a CMOS charge pump has been described which biases the well of a memory array a fixed amount above the supply voltage. The charge pump of the present invention provides constant frequency with low power consumption and process insensitivity.

I claim:

1. A device for biasing a well of a first conductivity type to a well voltage, exceeding a first voltage by a first reference voltage, said device comprising:
   current generating means having first and second outputs, said current generating means for producing a current independent of said first voltage;
   frequency generating means coupled to said first and second outputs, said frequency generating means having third and fourth outputs;
   level shifting means coupled to said third and fourth outputs, said level shifting means for raising the voltage level of said third and fourth outputs;
   clock generating means coupled to said level shifting means, said clock generating means for generating a plurality of clocking signals;
   charge pumping means coupled to said clock generating means, said charge pumping means for biasing said well;
   first comparing means coupled to said well, said first comparing means for comparing said well voltage to said first reference voltage, said first comparing means having a fifth output coupled to said frequency generating means for controlling the output of said frequency generating means.

2. The device of claim 1 further including second comparing means coupled to said well, said second comparing means for comparing said well voltage to a second reference voltage, said second comparing means having a sixth output coupled to said memory array, said sixth output for controlling the power up of said array.

3. The device of claim 1 wherein said frequency generating means comprises a multivibrator oscillator.

4. The device of claim 3 wherein said fourth output is the complement of said third output.

5. The device of claim 1 wherein said first reference voltage value is approximately 2.5 volts.

6. The device of claim 2 wherein said second reference voltage is approximately 300 millivolts in excess of said first voltage.

7. The device of claim 1 wherein said plurality of clocking signals are non-overlapping.

8. The device of claim 1 wherein said first voltage comprises a supply voltage.

9. The device of claim 1 wherein said first voltage comprises a substrate voltage.

10. The device of claim 1 wherein said device is fabricated utilizing complementary metal-oxide-silicon (CMOS) technology.

11. A device for biasing a well of a first conductivity type to a well voltage exceeding a first voltage by a first reference voltage, said device comprising:
   a constant current source coupled to said first voltage and a second voltage, said constant current source outputting biasP and biasN signals, said biasP and biasN signals being independent of said first voltage;
   a multivibrator oscillator coupled to said biasP and biasN signals, said oscillator outputting a differential output signal having a frequency independent of said first voltage;
   a level shifter coupled to said differential output signal for amplifying said differential output signal;
   a clock generator coupled to said level shifter, said clock generator for generating a plurality of non-overlapping clock signals;
   a charge pump coupled to said clock generator and to said well for biasing said well to said well voltage;
   a translation means coupled to said well for generating the difference between said well voltage and said first voltage;
   a first comparing means coupled to said translation means and said first reference voltage for comparing said difference to said first reference voltage, said first comparing means having an output coupled to said oscillator for powering down said oscillator when said difference exceeds said first reference voltage.

12. The device of claim 11 wherein said first voltage comprises a supply voltage.

13. The device of claim 11 wherein said device is fabricated utilizing complimentary metal-oxide-silicon (CMOS) technology.

14. The device of claim 11 wherein said first reference voltage is approximately 2.5 volts.

15. The device of claim 11 wherein said charge pump comprises a plurality of stages, each of said stages controlled by a capacitor, each of said capacitors alternately charging and discharging in opposition to adjoining capacitors.

16. The device of claim 11 wherein said device is utilized to bias the well of a memory array.

17. The device of claim 16 further including second comparing means coupled to said well, said second comparing means for comparing said well voltage to a second reference voltage, the output of said second comparing means controlling the power up of said memory array.

18. The device of claim 17 wherein said second reference voltage is approximately 300 millivolts in excess of said first voltage.

* * * * *